United States Patent

Kawasumi

[11] Patent Number: 6,049,490
[45] Date of Patent: Apr. 11, 2000

[54] DECODED SIGNAL COMPARISON CIRCUIT

[75] Inventor: Atsushi Kawasumi, Yokohama, Japan

[73] Assignee: Kabushiki Kaisha Toshiba, Kawasaki, Japan

[21] Appl. No.: 09/126,302

[22] Filed: Jul. 30, 1998

[30] Foreign Application Priority Data

Aug. 6, 1997 [JP] Japan .................................. 9-212028

[51] Int. Cl.[7] .................................................. G11C 13/07
[52] U.S. Cl. ..................................... 365/189.07; 365/241
[58] Field of Search ......................... 365/189.01, 230.06, 365/230.01, 241

[56] References Cited

U.S. PATENT DOCUMENTS 5,933,388   8/1999   Choi ................................... 365/230.06

*Primary Examiner*—Terrell W. Fears
*Attorney, Agent, or Firm*—Loeb & Loeb, LLP

[57] ABSTRACT

A decoded signal comparison circuit comprises a plurality of decoders, each decoding address signals input in units of at least two bits, the address signals having bits which are input time-sequentially. It also comprises a first register group including a plurality of first registers respectively provided for outputs from the decoders, each first register temporarily storing an output from the corresponding decoder, and a second register group including a plurality of second registers respectively provided for the first registers of the first register group, each second register temporarily storing an output from the corresponding first register. A plurality of bit signal comparison circuits compare a pair of 1-bit signals input thereto. The pair of 1-bit signals consist of the outputs from the first register of the first register group and the second register of the second register group. Each bit signal comparison circuit is activated by one of the pair of 1-bit signals which is output from one of the first and second registers. The number of the bit signal comparison circuits correspond to the number of pairs of first and second registers. A plurality of wired OR circuits are respectively provided for the decoders, for obtaining a logical OR of signals output from the bit signal comparison circuits. A global comparison circuit detects coincidence/non-coincidence of signals output from the wired OR circuits. When the coincidence signal is obtained a Hit signal is outputted.

9 Claims, 8 Drawing Sheets

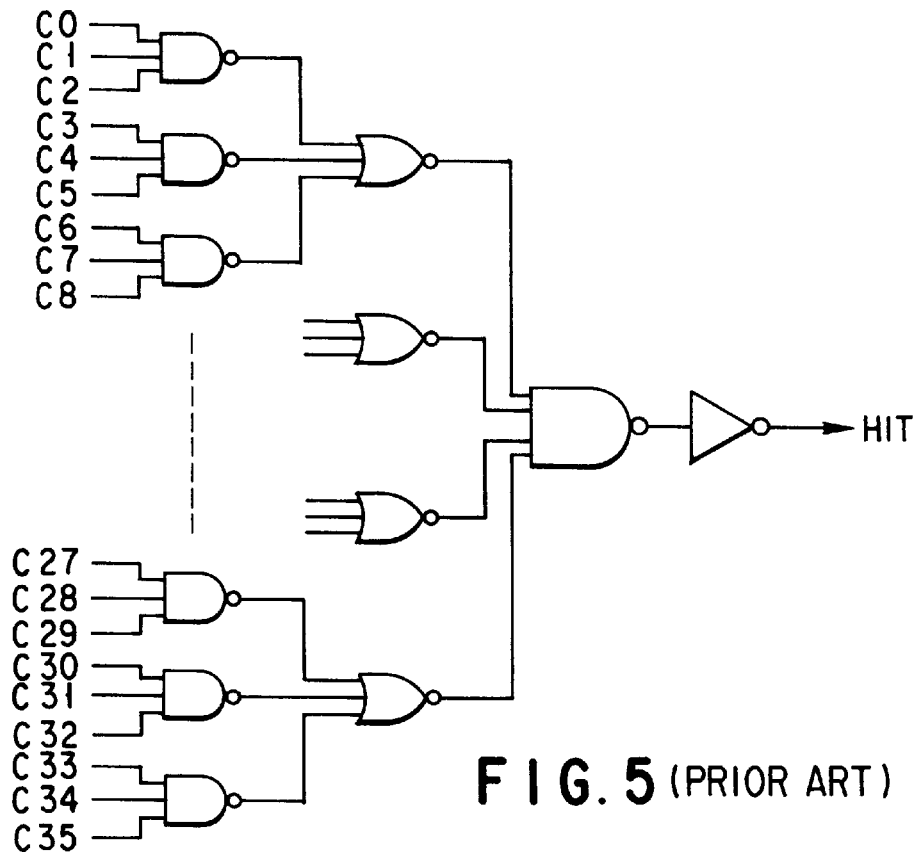
FIG. 5 (PRIOR ART)
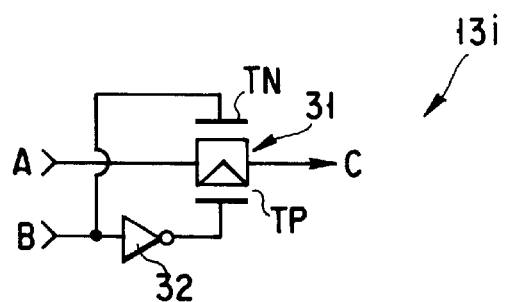
FIG. 8
FIG. 9

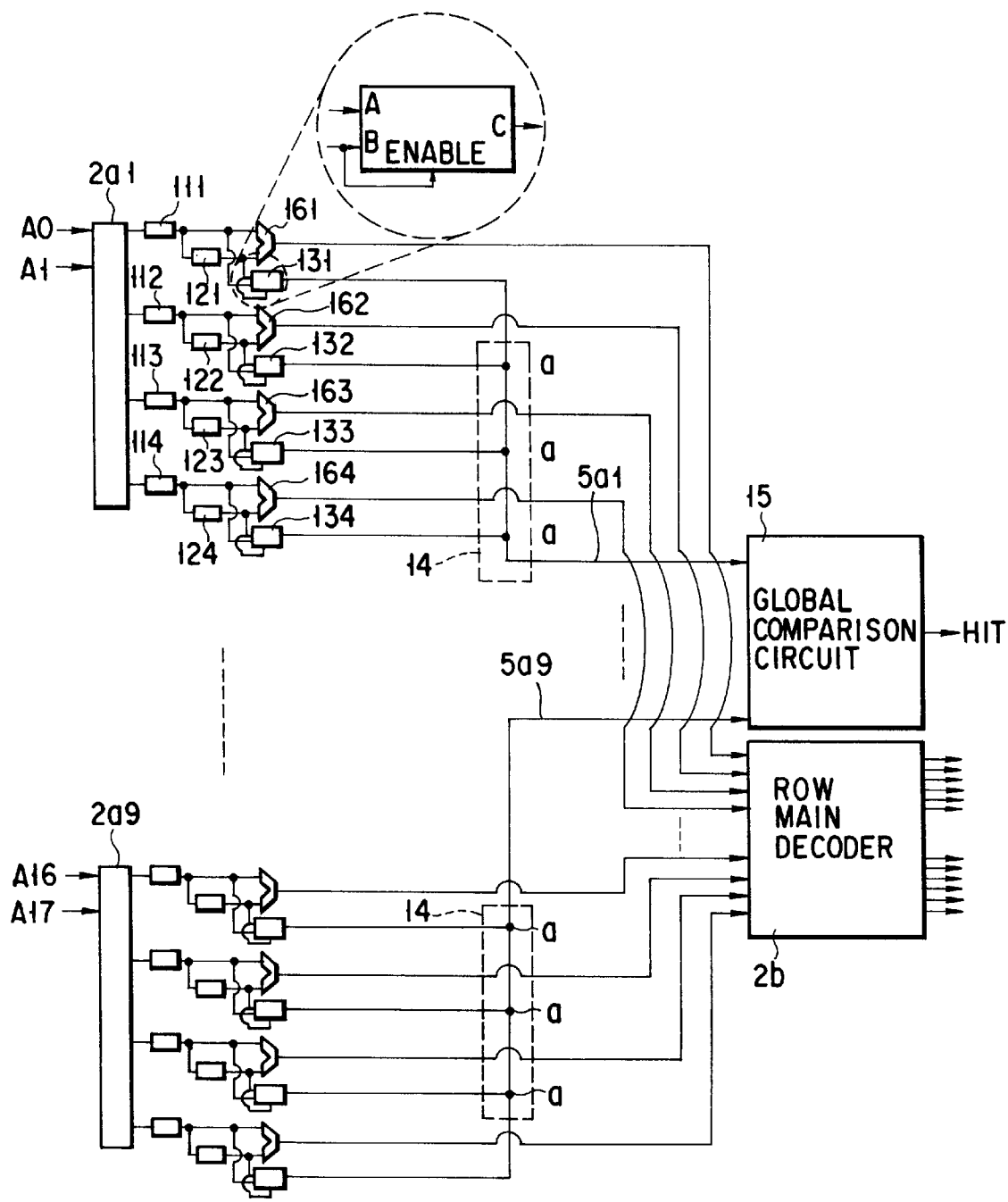
F I G. 7

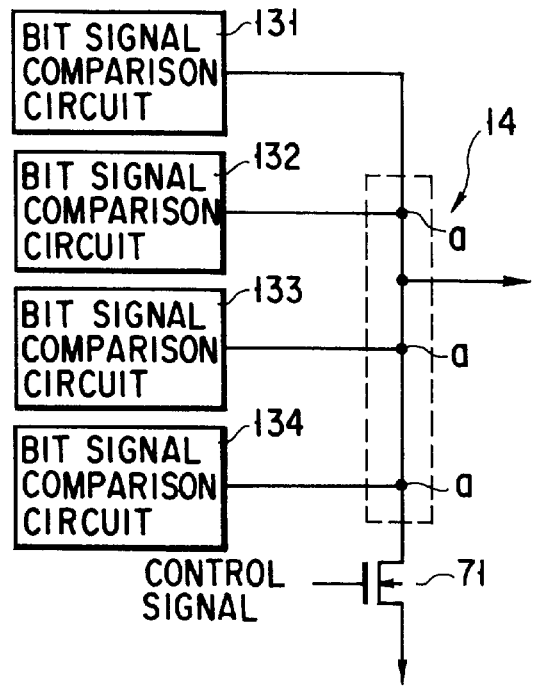
F I G. 13
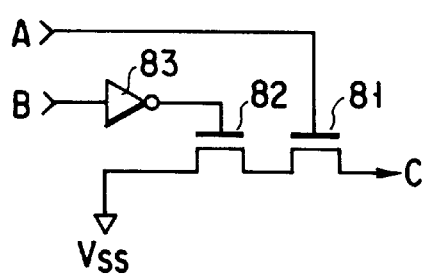
F I G. 14
| A B | | LOW | HI |
|---|---|---|---|
| LOW | | HI-Z | LOW (MISS) |
| HI | | HI-Z | HI-Z |
F I G. 15
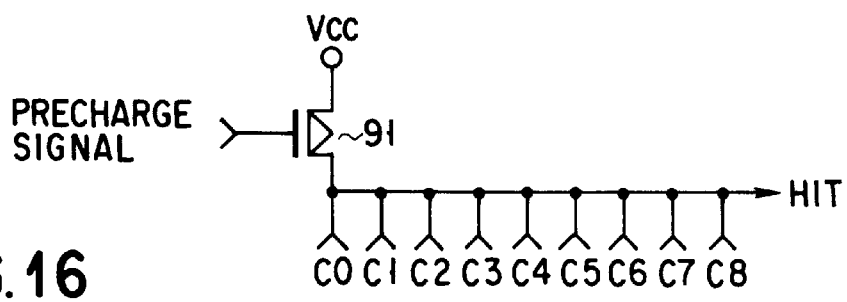
F I G. 16

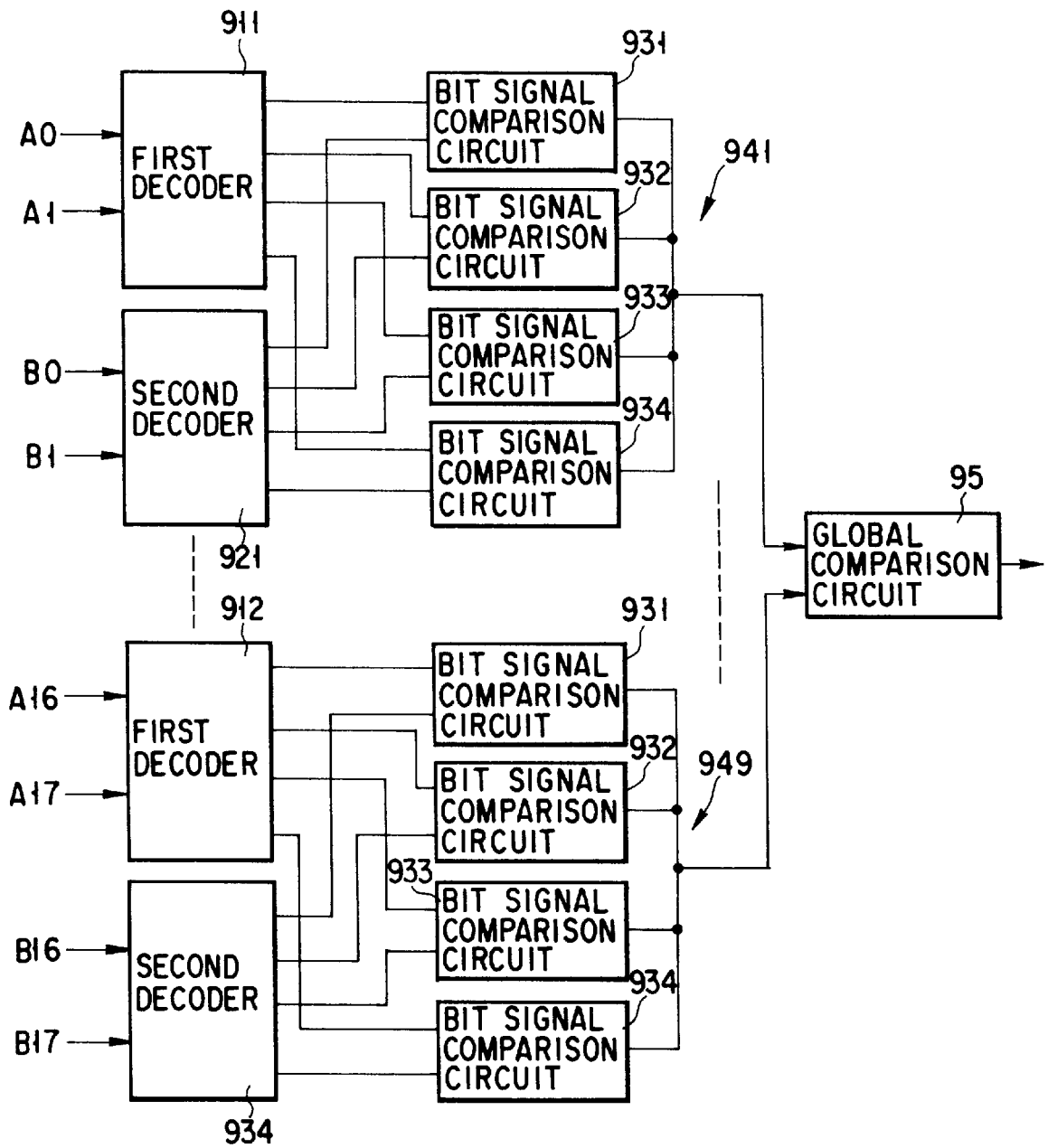
F I G. 17

DECODED SIGNAL COMPARISON CIRCUIT

BACKGROUND OF THE INVENTION

The present invention relates to a decoded signal comparison circuit formed in a semiconductor integrated circuit, and more particularly to a circuit for comparing two sets of decoded digital signals to detect coincidence/non-coincidence of bit structures, i.e., a decoded signal comparison circuit used as an address comparator for detecting coincidence of bit structures of a write address decoded signal and a read address decoded signal in a high-speed synchronous SRAM (static random access memory) having, for example, a late write specification.

The late write specification, which comes to be used in a high-speed synchronous SRAM in recent years, will be described with reference to a timing chart shown in FIG. 1.

In FIG. 1, "R", "W" and "dummy" represent a read cycle, a write cycle, and a dummy cycle.

As shown in FIG. 1, write data D3 is input in the cycle next to that when a write address Add3 is input, and write data D4 is input in the cycle next to that when a write address Add4 is input. A write operation inside a memory is performed in or after the cycle next to the cycle when the write data is input, not in the cycle when the write address is input.

In this case, a read address Add5 can be input in a cycle when the write data D4 is input. The read address Add5 is input and stored in a register, immediately after the write data D4 is input. In the cycle when the read address Add5 is input, a write operation inside the memory is not performed. The write data D4 input in this cycle and the write address Add4 input in the preceding cycle are stored in the registers.

An operation of writing the stored write data D4 is performed in the next write cycle.

More specifically, in a cycle when a read address Add6 is input, the read address Add6 is compared with the write address Add5 input and stored in the preceding cycle by means of an address comparison circuit. If the bit signals of the addresses coincide, the write data D4 input and stored in the preceding cycle is output as read data.

Generally, in the synchronous SRAM, since an address register and a read data register are arranged with a memory array interposed therebetween, the operation frequency of the memory is determined by a maximum value of a delay time of a signal transferred between the registers. Therefore, it is preferable that the address register storing the aforementioned two sets of addresses Add5 and Add6 be located near the memory cell array in an address path. Accordingly, it is preferable that the address comparison circuit be also located near the address path.

For this reason, conventionally, as shown in FIG. 2 address comparison circuits CPi (i=1 to 36) are inserted to output sides of a plurality of predecoders 2ai (i=1 to 9) for decoding an 18-bit address input in units of two bits.

First address inputs A0 and A1 are input to a predecoder 2a1. Decode outputs of four bits from the predecoder 2a1 are temporarily stored in first registers 11i (i=1 to 4). Then, bit signals of the first registers 11i (i=1 to 4) are stored in second registers 12i (i=1 to 4). Bit signals output from a pair of registers 11i and 12i are compared by a bit line comparison circuit CPi (i=1 to 4).

Next, second address inputs A2 and A3 are input to a predecoder 2a2. Decode outputs of four bits from the predecoder 2a2 are stored in first and second registers 11i and 12i. Then, bit signals output from a pair of registers 11i and 12i are compared by a bit signal comparison circuit CPi (i=1 to 4).

Comparison outputs from the bit signal comparison circuits CPi (i=1 to 4) provided for each predecoder 2ai (i=1 to 9) are input to a global comparison circuit 130, which detects whether the outputs coincide with each other. Thus, it is detected whether all bits of the two sets of address inputs (the first and second address inputs which are time-sequentially input) coincide or not.

In FIG. 2, one of the two bit signals output from the pair of registers 11i and 12i is selected by a multiplexer 16i (i=1 to 4), and thereafter input to and decoded by a main decoder 2b.

In the above structure, according to the conventional art, an exclusive OR gate, for example, as shown in FIG. 3, is used as the bit signal comparison circuit CPi (i=1 to 4). The exclusive OR gate, which operates based on a truth table as shown in FIG. 4, is comparatively complicated in structure and large in circuit scale. In addition, it consumes a comparatively large amount of current. If every predecoder 2ai (i=1 to 9) requires four exclusive OR gates as described above, i.e., 36 exclusive OR gates in total are required, the amount of power consumption and the area of the pattern layout must be increased.

Moreover, the global comparison circuit 130 must have a number of gate circuits to which a great number of signals are input, as shown in FIG. 5, in order to detect coincidence or non-coincidence of bit outputs from the aforementioned 36 exclusive OR gates.

As a result, the address comparison circuit including the conventional global comparison circuit causes an increase in signal delay time (comparing operation time), power consumption and the area of the pattern layout.

As described above, the conventional decoded signal comparison circuit for comparing two sets of decoded digital signals requires bit signal comparison circuits CPi (i=1 to 4) having a number of exclusive OR gates of a comparatively complicated structure and a global comparison circuit to which a great number of signals are input. Therefore, the signal comparison circuit has problems that it requires a long comparison operation time, a large amount of power, and a large area for the pattern layout.

A semiconductor device in which the late write system is realized in a synchronous SRAM is disclosed in, for example, Jpn. Pat. Appln. KOKAI Publication No. 8-45277.

BRIEF SUMMARY OF THE INVENTION

The present invention has been made to solve the above problems. It is accordingly an object of the present invention to provide a decoded signal comparison circuit for comparing two sets of decoded digital signals with a simple circuit configuration to detect coincidence or non-coincidence of signals, in which the comparison operation time, the power consumption and the area of the pattern layout can be prevented from increasing.

To achieve the above object, according to an aspect of the present invention, there is provided a decoded signal comparison circuit comprising:

a plurality of decoders, each decoding address signals input in units of at least two bits, the address signals having bits which are input time-sequentially;

a first register group including a plurality of first registers respectively provided for outputs from the plurality of decoders, each first register temporarily storing an output from the corresponding decoder;

a second register group including a plurality of second registers respectively provided for the first registers of the first register group, each second register temporarily storing an output from the corresponding first register;

a plurality of bit signal comparison circuits for comparing a pair of 1-bit signals input thereto, the pair of 1-bit signals consisting of the outputs from the first register of the first register group and the second register of the second register group, each bit signal comparison circuit being activated by one of the pair of 1-bit signals which is output from one of the first and second registers, the plurality of bit signal comparison circuits corresponding in number to pairs of first and second registers;

a plurality of wired OR circuits respectively provided for the plurality of decoders, for obtaining a logical OR of signals output from the plurality of bit signal comparison circuits; and a global comparison circuit for detecting coincidence/non-coincidence of signals output from the plurality of wired OR circuits.

According to another aspect of the present invention, there is provided a decoded signal comparison circuit comprising:

a first decoder group including a plurality of first decoders, each receiving address signals in units of at least two bit signals and decoding the address signals;

a second decoder group including a plurality of second decoders, each receiving address signals having a same number of bits as that of the address signals supplied to the plurality of first decoders of the first decoder group and decoding the address signals;

a plurality of bit signal comparison circuits, provided for a plurality of pairs of first and second decoders of the first and second decoder groups, each of the plurality of bit signal comparison circuits receiving a 1-bit signal output from the first decoder and a 1-bit signal output from the second decoder and comparing the two 1-bit signals every time they are input, and each of the plurality of bit signal comparison circuits being activated by one of the two 1-bit signals, which is output from one of a pair of first and second decoders;

a plurality of wired OR circuits respectively provided for the plurality of pairs of first and second decoders, for obtaining a logical OR of signals output from the plurality of bit signal comparison circuits; and a global comparison circuit for detecting coincidence/non-coincidence of signals output from the plurality of wired OR circuits.

According to still another aspect of the present invention, there is provided a decoded signal comparison circuit comprising:

a plurality of bit signal comparison circuits activated by one of two bit inputs constituting a digital decoded signal input thereto and comparing the two bit inputs with each other; and a plurality of wired OR circuits commonly connecting signals output from the plurality of bit signal output circuits and obtaining a logical OR of the output signals.

According to still another aspect of the present invention, there is provided decoded signal comparison circuit comprising:

a first decoder for receiving address signals in units of at least 2-bit signals, decoding the address signals and outputting a plurality of decoded bit signals;

a second decoder for receiving address signals having a same number of bits as that of the address signals supplied to the first decoder, decoding the address signals and outputting a plurality of decoded bit signals; and a plurality of bit signal comparison circuits, provided for a plurality of pairs of first and second decoders, each of the plurality of bit signal comparison circuits receiving a 1-bit signal output from the first decoder and a 1-bit signal output from the second decoder and comparing the two 1-bit signals every time they are input, and each of the plurality of bit signal comparison circuits being activated by one of the two 1-bit signals, which is output from one of a pair of first and second decoders.

The decoded signal comparison circuit of the present invention with the above structure can compare two sets of decoded digital signals with a simple circuit configuration to detect coincidence or non-coincidence of signals, in which the comparison operation time, the power consumption and the area of the pattern layout can be prevented from increasing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram showing a circuit configuration of the global comparison circuit illustrated in FIG. 2;

FIG. 7 is a circuit diagram showing concrete structures of the predecoder, the address comparison circuit and the main decoder illustrated in FIG. 6;

FIG. 8 is a diagram showing a circuit configuration of the bit signal comparison circuit illustrated in FIG. 7;

FIG. 9 is a truth table for explaining an operation of the bit signal comparison circuit illustrated in FIG. 8;

FIG. 13 is a circuit diagram showing a modification of the wired OR circuit illustrated in FIG. 7;

FIG. 14 is a diagram showing a circuit configuration of a bit signal comparison circuit used in an address comparison circuit according to a second embodiment of the present invention;

FIG. 15 is a truth table for explaining an operation of the bit signal comparison circuit illustrated in FIG. 14;

FIG. 16 is a diagram showing a circuit configuration of the global comparison circuit used in the address comparison circuit according to the second embodiment of the present invention; and FIG. 17 is a diagram showing a circuit configuration of an address comparison circuit according to a third embodiment of the present invention.

DETAILED DESCRIPTION OF THE INVENTION

Embodiments of the present invention will be described with reference to the accompanying drawings.

Figure 6:
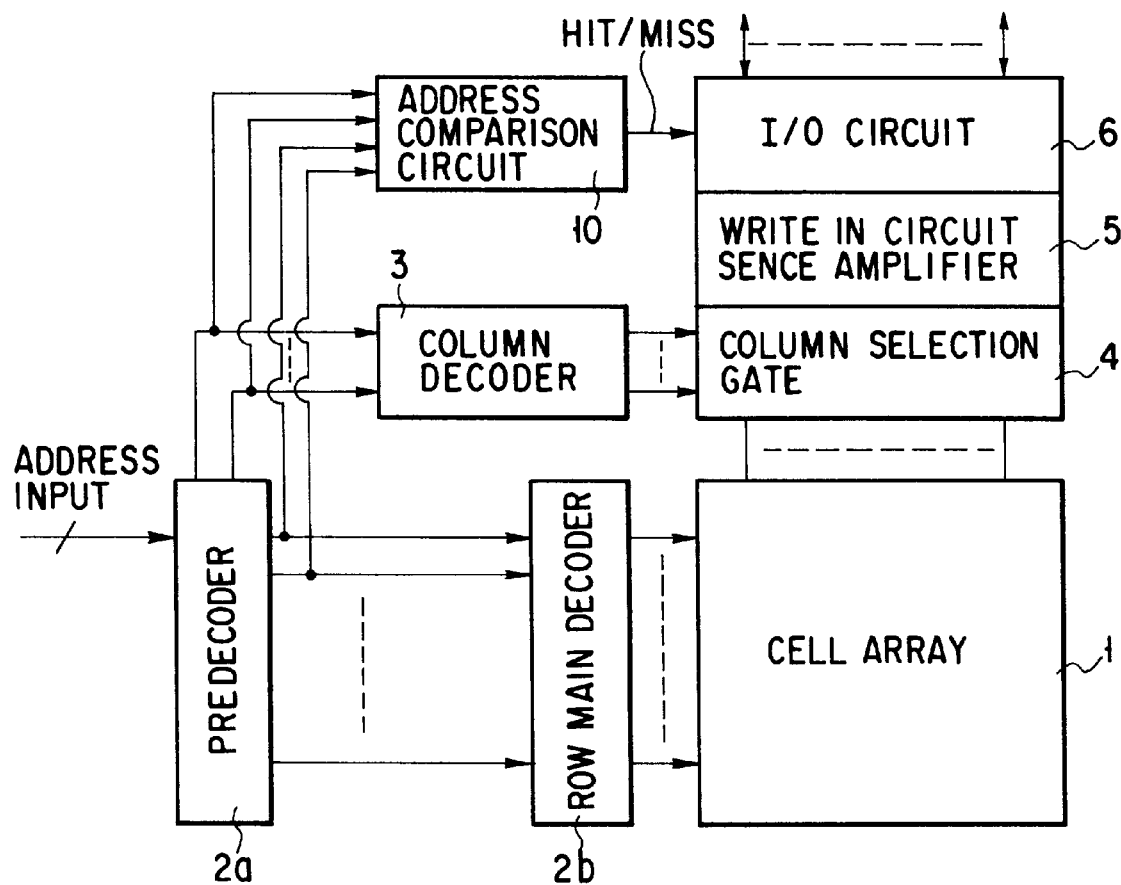
FIG. 6 is a block diagram showing a configuration of a high-speed synchronous SRAM having the late write specification as an example of a semiconductor memory in which an address comparison circuit according to a first embodiment of a decoded signal comparison circuit of the present invention is used.

FIG. 6 schematically shows a configuration of a high-speed synchronous SRAM having the late write specification as an example of a semiconductor memory in which an address comparison circuit 10 according to a first embodiment of a decoded signal comparison circuit of the present invention is used.

A SRAM comprises, as basic elements, a SRAM cell array 1, a predecoder 2a serving as a row address decoder, a row main decoder 2b, a column decoder 3 serving as a column address decoder, a column selection gate 4, a sense amplifier 5 and an input/output circuit 6.

Figure 1:
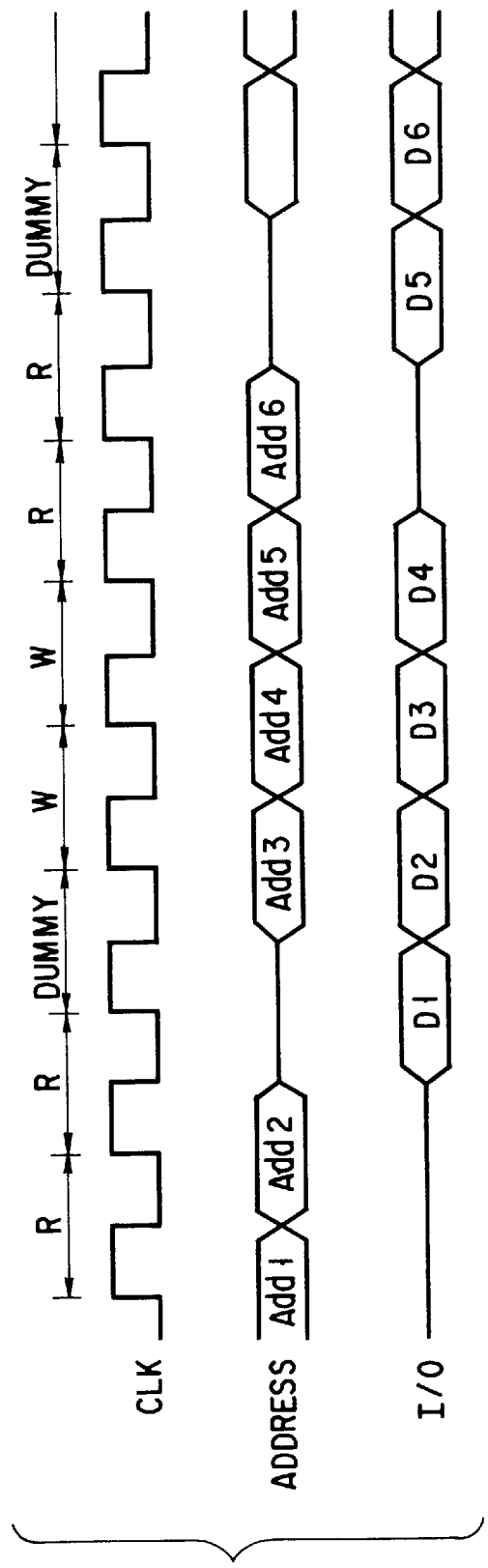
FIG. 1 is a waveform diagram for explaining a timing at which a write address decoded signal and a read address decoded signal are compared in the late write specification employed in the conventional high-speed synchronous SRAM.
Figure 4:
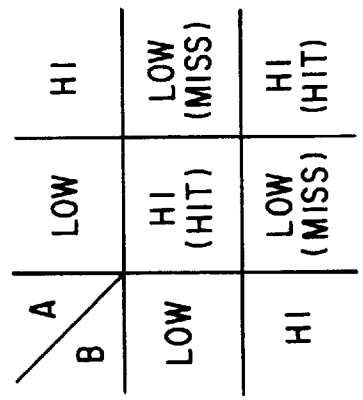
FIG. 4 is a truth table for explaining an operation of the bit signal comparison circuit illustrated in FIG. 3.
Figure 3:
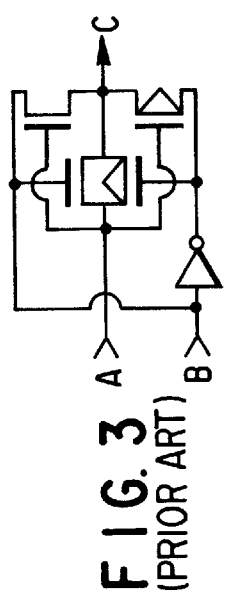
FIG. 3 is a diagram showing a circuit configuration of the bit signal comparison circuit illustrated in FIG. 2.
Figure 2:
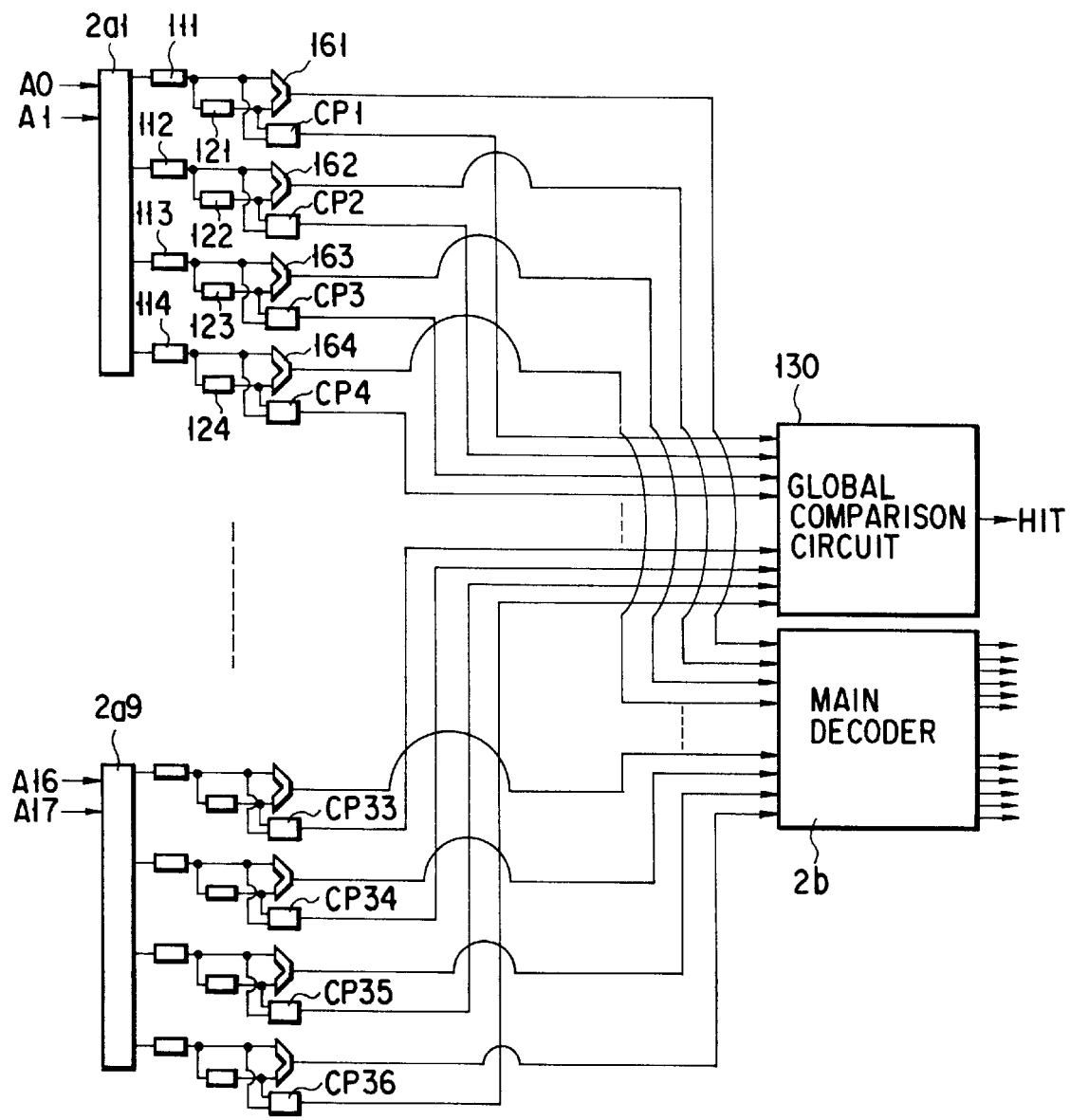
FIG. 2 is a block diagram showing a configuration of an address comparison circuit employed in the conventional high-speed synchronous SRAM.

In a high-speed synchronous SRAM having the late write specification, as described before with reference to FIG. 1, an address comparison circuit 10 is used to compare a bit signal of a read address Add6 with a bit signal of a write address Add5 input which is stored in a register in the preceding cycle.

The address comparison circuit 10 is preferably arranged near the register. It compares the structures of two sets of digital signals decoded by the predecoder 2a to detect coincidence or non-coincidence of the bit structures. A detection output (Hit/Miss) is supplied to the input/output circuit 6.

FIG. 7 shows an interconnection structure of the predecoder 2a, the address comparison circuit 10 and the row main decoder 2b illustrated in FIG. 6.

The circuit of FIG. 7 compares addresses of decoded outputs of predecoders 2a1 to 2a9 of the same structure used for address signal sets of two bits: (A0, A1); (A2, A3); . . . ; and (A16, A17), respectively.

In this embodiment, a set of two bits of address signals (A0, A1) to (A16, A17) is input as one unit to each of the predecoders 2a1 to 2a9. However, more than two bits of address signals A0 to A17 can be input as one unit.

In FIG. 7, the address signals A0 to A17 are divided in units of two bits (A0, A1) to (A16, A17) into nine groups, for which the predecoders 2a1 to 2a9 are respectively provided.

The bits of an output from each predecoder 2a1 to 2a9 (four bits of a decoded output in this embodiment) are respectively input to a plurality of first registers 11$i$ (i=1 to 4 in this embodiment).

Outputs of the first registers 111 to 114 are respectively input to a plurality of second registers 12$i$ (i=1 to 4 in this embodiment).

Pairs of bit signals respectively output from the pair of registers 11$i$ and 12$i$ are input to a plurality of bit signal comparison circuits 13$i$ (i=1 to 4 in this embodiment) respectively provided for pairs of first and second registers 111 to 114 and 121 to 124. In this case, one of the two bit input signals, which is output from one of the pair of registers (the second register 12$i$ in this embodiment), serves as an activation control signal.

In each of the predecoders 2a1 to 2a9, output signal lines of the bit signal comparison circuits 131 to 134 are wired OR connected. An interconnecting section including wired OR connection nodes (a) functions as a wired OR circuit 14.

Output signals from the wired OR circuits (nine circuits in this embodiment) are input to a global comparison circuit 15.

A multiplexer 16$i$ (i=1 to 4 in this embodiment) is provided for each pair of registers 11$i$ and 12$i$. Two bit signals output from the pair of registers 11$i$ and 12$i$ are input to the multiplexer 16$i$.

An operation related to the address comparison circuit in the SRAM shown in FIG. 6 will now be described.

In a high-speed synchronous SRAM of the late write specification, as described before with reference to FIG. 1, the write data D4 is input in the cycle next to that when the write address Add4 is input. A write operation inside a memory is performed in or after the cycle next to the cycle when the write data D4 is input, not in the cycle when the write address Add4 is input.

In this case, a read address Add5 can be input in a cycle when the write data D4 is input. When the read address Add5 is input at the same time the write data D4 is input, a write operation inside the memory is not performed in this cycle. The write data D4 input in this cycle and the write address Add4 input in the preceding cycle are stored in the registers. A writing operation of the stored write data D4 is performed in the next cycle.

More specifically, in a cycle when a read address Add6 is input, the read address Add6 is compared with the write address Add5 input and stored in the immediately preceding cycle by means of the address comparison circuit 10. If the bit signals of the addresses coincide, the write data D4 input and stored in the previous cycle is output as read data.

A comparing operation of the address comparison circuit 10 shown in FIG. 6 will be described with reference to the circuit diagram of FIG. 7.

A set of two bits of address signals (A0, A1) to (A16, A17), constituting nine groups, is input as one unit to each of the predecoders 2a1 to 2a9.

Decode outputs of a plurality of bits (four bits in this embodiment) output from the respective predecoders 2a1 to 2a9 are temporarily stored in the corresponding first registers 11$i$ (i=1 to 4).

The bit signals read from the first registers 111 to 114 at a predetermined timing (related to the late write specification) are temporarily stored in the corresponding second registers 12$i$ (i=1 to 4).

Two bit signals read from the pair of registers 11$i$ and 12$i$ are input to the bit signal comparison circuit 13$i$ (i=1 to 4 in this embodiment) provided for each pair of first and second registers 111–114 and 121–124. The bit signal comparison circuit 13$i$ is activated by one of the two bit signals read from one of the pair of registers (the second register 12$i$ in this embodiment) and compares the two bit signals input thereto.

In each of the predecoders 2a1 to 2a9, logical ORs of output signals from the corresponding bit signal comparison circuits 131 to 134 are obtained by the wired OR circuit 14. The output signals from the wired OR circuits (nine circuits in this embodiment) are input to the global comparison circuit, which detects whether the bit structures of the output signals coincide or not. When a coincidence signal is obtained, a Hit signal is outputted.

The multiplexer 16i (i=1 to 4 in this embodiment) provided for each pair of registers 11i and 12i selects one of the two bit signals read from the registers 11i and 12i. The signal selected by the multiplexer is input to and decoded by the main decoder 2b.

As regards the circuit configuration shown in FIG. 7, it should be noted that only one bit of a plurality of bits (four bits in this embodiment) of the decoded outputs from each of the predecoders 2a1 to 2a9 is in a selected activation state, for example, "H" level.

Therefore, when one of the pairs of 1-bit signals input to the four bit signal comparison circuits 131 to 134 provided in the respective predecoders coincide at the selected state (for example, "H" level), the other three pairs of 1-bit signals coincide at the non-selected state (for example, "L" level). At this time in one of the bit signal comparison circuits 13i, two bit inputs coincide at "H" level, and the bit signal comparison circuit becomes a "Hit" output state. In the other three bit signal comparison circuits, the two bit inputs coincide at "L" level, but the bit signal comparison circuits must be in an inactive state.

Therefore, according to this embodiment, an "H" level coincidence comparison circuit as shown in FIG. 8, for performing an operation as indicated by the truth table shown in FIG. 9, is used as each bit signal comparison circuit 13i, so that output nodes of the bit signal comparison circuits can be connected in common in the wired OR circuit 14.

More specifically, a first bit signal input A is input to one end of a CMOS transfer gate 31 and an output signal C is output from the other end thereof. A second bit signal input B is input to the gate terminal of an NMOS transistor TN and a signal /B (an inverted signal of the bit signal input B) is input to the gate terminal of a PMOS transistor TP.

In this case, if the bit signal input B, which is defined earlier than the bit signal input A, is used as a control signal, a stable comparison output can be obtained, since the signal A is input after the operation or non-operation of the bit signal comparison circuit has been determined.

Therefore, it is preferable that an output of the second register 12i, whose data is defined earlier than that of the first register 11i, be assigned to the bit signal input B.

In the embodiment shown in FIG. 8 as described above, the bit signal input B and the inverted signal /B are used as control signals. However, if the bit signal input A is defined earlier, it can be used as a control signal.

The bit signal comparison circuit 13i described above outputs a signal of an "H" level, when the combination of the levels of the two bit inputs A and B is of "H" level. In the other combinations, the output of the bit signal comparison circuit 13i is of an "L" level signal or high impedance.

Therefore, a wired OR of the signals of four bits output from the four bit signal comparison circuits 131 to 134 can be obtained in each predecoder 2a1 to 2a9. With this structure, it can be determined that two sets of preceded signals coincide only by detecting coincidence of the structures of bits in the selected state of the predecoded signals input to the bit comparison circuit.

Figure 10:
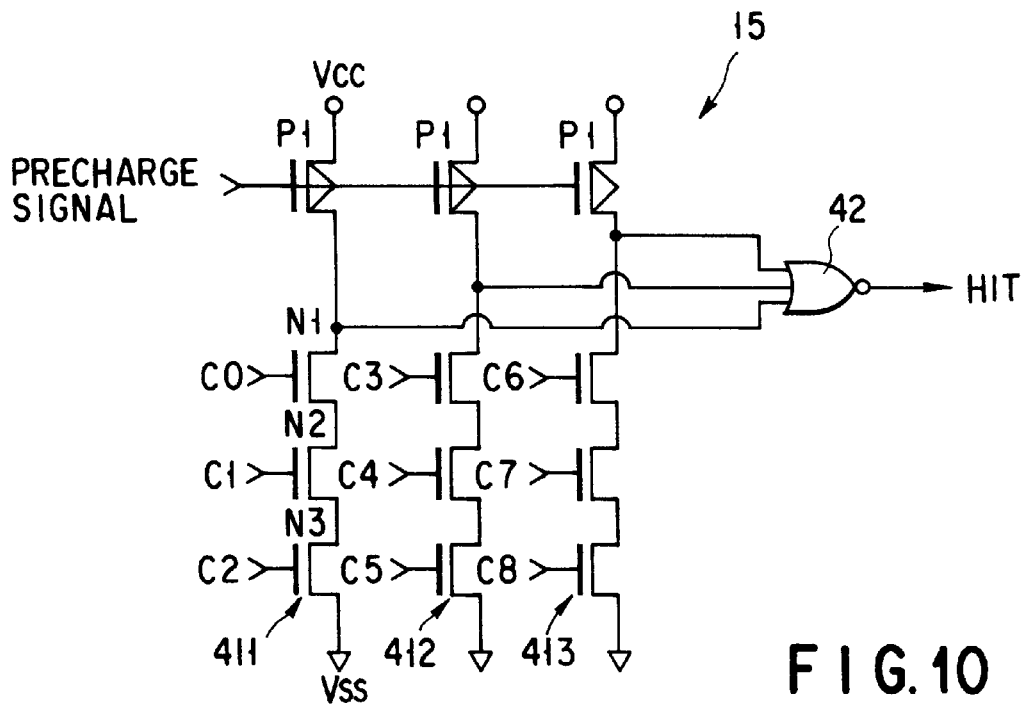
FIG. 10 is a diagram showing a circuit configuration of the global comparison circuit illustrated in FIG. 7.

Further, outputs of the bit signal comparison circuits 131 to 134 are wired OR connected, thereby constituting one output signal 5a1. Therefore, since the global comparison circuit 15 requires a less number of output signals 5a1 to 5a9, i.e., nine in this embodiment, it is possible to use the structure as shown in FIG. 10. FIG. 10 shows the global comparison circuit 15. The global comparison circuit 15 comprises: three precharging PMOS transistor P1, to each gate of which a precharge control signal is input; three 3-input NAND circuits 411 to 413 of precharge/discharge type; and a 3-input NOR circuit 42 to which output signals from the NAND circuits 411 to 413 are input. Each of the 3-input NAND circuits 411 to 413 comprises three NMOS transistors N1 to N3 for logical input connected in series.

In the global comparison circuit 15 shown in FIG. 10, during a precharge period, the precharge control signal is in the active state ("L" level), so that the precharging transistor P1 is turned on to set the NAND circuits 411 to 413 to the precharge state.

During a comparison operation period, the precharge control signal is in the inactive state ("H" level), so that the precharging transistor P1 is turned off to allow a logical AND operation (discharge operation) by the three NMOS transistors N1 to N3.

In the address comparison circuit 10 according to the first embodiment of the present invention, since the bit signal comparison circuit 13i of a simple structure as shown in FIG. 8 is used, the circuit scale can be reduced as compared to the conventional address comparison circuit described above. In addition, predecoded signals can be compared by operating only one bit comparison circuit, in which a signal B defined earlier is in the selected state, of all a plurality of (four in this embodiment) bit comparison circuits in each predecoder 2ai. Accordingly, the power consumption can be reduced as compared to the case wherein all the bit comparison circuits are operated.

Further, in the case of using the bit signal comparison circuit 13i as shown in FIG. 8 which outputs a high-impedance output when it is not operated, it is possible to obtain a logical OR of four bit signals output from the four bit signal comparison circuits 131 to 134 in each predecoder 2ai. Thus, since the global comparison circuit can be simple as shown in FIG. 10, the circuit scale can be reduced.

As described above, with the address comparison circuit shown in FIG. 7, since the circuit scale of bit signal comparison circuit 13 and the global comparison circuit 15 can be reduced, the comparison operation time and the power consumption can be prevented from increasing. Moreover, since the circuit scale can be small, it is possible to realize an address comparison circuit whose area of the pattern layout is prevented from increasing.

Figure 11:
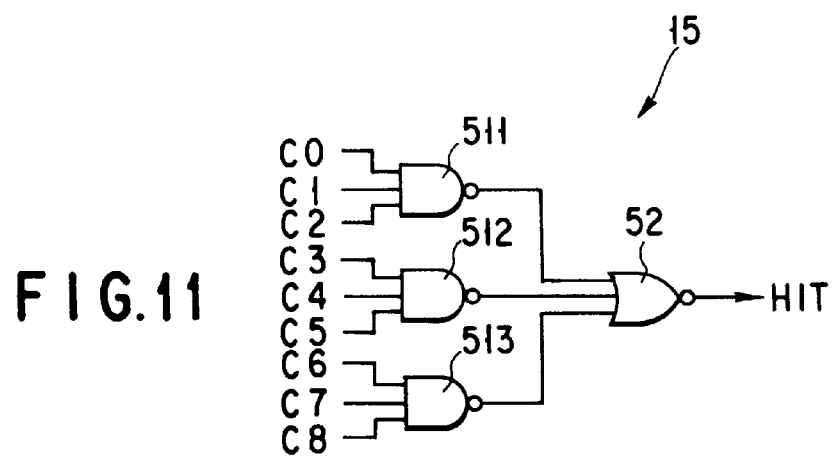
FIG. 11 is a diagram showing another circuit configuration of the global comparison circuit illustrated in FIG. 7.

FIG. 11 shows a modification of the global comparison circuit illustrated in FIG. 10.

The global comparison circuit 15 comprises three 3-input NAND circuits 511–513, and a 3-input NOR circuit 52 to which output signals from the NAND circuits 511 to 513 are input.

Figure 12:
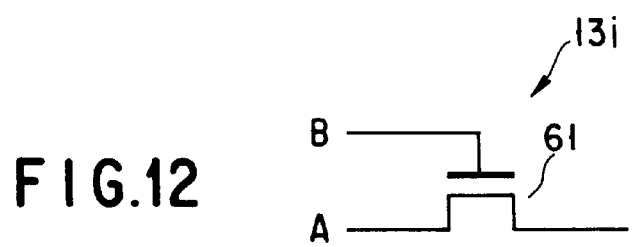
FIG. 12 is a diagram showing another circuit configuration of the bit signal comparison circuit illustrated in FIG. 7.

FIG. 12 shows a modification of the bit signal comparison circuit 13i illustrated in FIG. 8.

In the bit signal comparison circuit 13i, a first bit signal input A is input to one end of an NMOS transistor 61 and a second bit signal input B is input to the gate of the NMOS transistor 61 as a control signal. A comparison result is output from the other end of the NMOS transistor 61.

FIG. 13 shows a modification of the wired OR circuit 14 illustrated in FIG. 7.

In the wired OR circuit 14 of this modification, a discharge NMOS transistor 71 is connected between a wired OR connection node (a) and a predetermined potential node (ground node in this embodiment). Alternatively, a precharge PMOS transistor may be connected to a power source node and a wired OR connection node (a).

With the wired OR circuit 14 as described above, even if the wired OR connection node (a) becomes floating in respect of potential, depending on the characteristics of the bit signal comparison circuit 13$i$ connected thereto, the wired OR connection node (a) can be stably fixed to a predetermined potential.

It is possible to set (precharge or discharge) the logical level of the wired OR connection node (a) to an output level of the bit signal comparison circuit 13$i$ at the address non-coincidence time in a standby operation, and invert (discharge or precharge) at high speed the logical level of the wired OR connection node (a) at the address coincidence time in a bit signal comparison operation of the address comparison circuit 10.

An address comparison circuit according to a second embodiment of the present invention will be described.

An address comparison circuit 10 of the second embodiment is the same as the address comparison circuit of the first embodiment, except for the structures of bit signal comparison circuits 13$i$ and a global comparison circuit 15.

FIG. 14 shows the structure of a bit signal comparison circuit 13$i$ used in the address comparison circuit 10 according to the second embodiment. FIG. 15 is a truth table representing the operations of the bit signal comparison circuit.

In the bit signal comparison circuit 13$i$, first and second NMOS transistors 81 and 82 are connected in series between a comparison output node C and a grounded node. A first signal input (activation control signal) A is input to the gate of the first NMOS transistor 81. A second signal input B is inverted by an inverter circuit 83 and input to the gate of the second NMOS transistor 82.

When the combination of the levels of the activation control signal A and the second bit signal input B is the activation level ("H" level) and the "L" level, a comparison output node of the bit signal comparison circuit 13$i$ becomes "L" level (Low (miss)). In the other combinations, the comparison output node becomes high impedance (Hi-Z). Therefore, a wired OR of 4-bit output signals output from the four bit signal comparison circuits 13$i$ can be obtained in each predecoder 2a$i$.

FIG. 16 shows the structure of the global comparison circuit 15 used in the address comparison circuit 10 according to the second embodiment.

The global comparison circuit 15 is of precharge/discharge type, in which comparison output nodes Ci of a plurality of bit signal comparison circuits 13$i$ are connected to the drain of a precharge PMOS transistor 91. With this global comparison circuit, an "H" level is obtained as an address coincidence detection output by logical NAND of outputs from the plurality of bit signal comparison circuits 13$i$ shown in FIG. 14.

FIG. 17 shows another example of the address comparison circuit 10 according to a third embodiment of the present invention.

A plurality of first decoders 91$i$ (i=1 to 9) are provided for each of the groups, in which address signals of a first group are divided into units of at least two bit signals, and decode the bit signals in the corresponding group.

A plurality of second decoders 92$i$ (i=1 to 9) are provided for each of the groups, in which address signals of a second group having the same bit number as that of the address signals of the first group are divided in the same manner as the address signals of the first group, and decode the bit signals in the corresponding group.

Of the outputs of a plurality of bits (four bits in this embodiment), i.e., decoded outputs from the first and second decoders 91$i$ and 92$i$, outputs from the first decoder 91$i$ and the second decoder 92$i$ of the corresponding bit are paired and input to one of the plurality of bit signal comparison circuits 931 to 934.

The bit signal comparison circuits 931 to 934 are the same as the bit signal comparison circuits 131 to 134 of the address comparison circuit of the first embodiment. More specifically, signals of two bits are input to the bit signal comparison circuits 931 to 934 from the corresponding pair of decoders. The bit signal comparison circuit is activated by the bit signal input from one of the pair of decoders (for example, the decoder 91$i$) and compares the two bit signal inputs.

A wired OR connection node (a) is provided for each pair of decoders 91$i$ and 92$i$ to obtain a logical OR of output signals from the corresponding bit signal comparison circuits 931 to 934. A wiring section including connection nodes (a) functions as a wired OR circuit 94$i$ (i=1 to 9).

A global comparison circuit 95 detects coincidence/non-coincidence of signals output from the wired OR circuits 94$i$. It is the same as the global comparison circuit 15 according to the first embodiment shown in FIG. 7.

In the address comparison circuit 10 of the third embodiment shown in FIG. 17 as described above, the operation is different from that of the address comparison circuit 10 of the first embodiment shown in FIG. 7 in that two sets of bit signal inputs A0, A1 and B0 and B1 are separately input to the two decoders 911 and 921. However, the operation is basically the same as that of the first embodiment, and the same effect can be obtained.

In the first embodiment, part of a plurality of bit signals input as an address input are decoded by the predecoder 2a$i$, and a plurality of decoded signals are compared with each other. However, if an address input has a comparatively small number of bits (for example, an address of a cache memory), the present invention can be applied to a case in which all the address inputs are decoded by decoders and decoded signals are compared with each other.

The present invention is not limited to the above embodiments. It can provide a decoded signal comparison circuit comprising a plurality of bit signal comparison circuits for comparing two bit inputs, to which the corresponding two bits of two sets of decoded digital signals are input and which is activated by the bit of one of the sets of digital signals, and wired OR connection nodes, to which output signals of the bit signal comparison circuits are connected in common, for obtaining logical OR of the output signals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A decoded signal comparison circuit comprising:
   a plurality of decoders, each decoding address signals input in units of at least two bits, said address signals having bits which are input time-sequentially;

a first register group including a plurality of first registers respectively provided for outputs from said plurality of decoders, each first register temporarily storing an output from the corresponding decoder;

a second register group including a plurality of second registers respectively provided for the first registers of the first register group, each second register temporarily storing an output from the corresponding first register;

a plurality of bit signal comparison circuits for comparing a pair of 1-bit signals input thereto, the pair of 1-bit signals consisting of the outputs from the first register of the first register group and the second register of the second register group, each bit signal comparison circuit being activated by one of the pair of 1-bit signals which is output from one of the first and second registers, said plurality of bit signal comparison circuits corresponding in number to pairs of first and second registers;

a plurality of wired OR circuits respectively provided for said plurality of decoders, for obtaining a logical OR of signals output from said plurality of bit signal comparison circuits; and a global comparison circuit for detecting coincidence/non-coincidence of signals output from said plurality of wired OR circuits.

2. The decoded signal comparison circuit according to claim 1, wherein each of said plurality of bit signal comparison circuits is activated upon reception of, as an activation control signal, an output from the first register, data of which is defined earlier than that of the second register.

3. The decoded signal comparison circuit according to claim 1, wherein each of said plurality of bit signal comparison circuits includes:

a CMOS transfer gate comprising an NMOS transistor and a PMOS transistor, said CMOS transfer gate having an end to which one of the pair of 1-bit signals is input, and another end from which a result of comparison between the pair of 1-bit signals is obtained; and a circuit for supplying another of the pair of 1-bit signals as a control signal to a gate of the NMOS transistor, and a complementary signal of said another of the pair of 1-bit signals as a control signal to a gate of the PMOS transistor.

4. The decoded signal comparison circuit according to claim 1, wherein:

each of said plurality of bit signal comparison circuits includes two NMOS transistors connected in series between a comparison output node and a grounded node, a first bit signal for activation control is supplied to a gate of one of the two NMOS transistors and an inverted signal of a second bit signal for activation control is supplied to a gate of another of the two NMOS transistors; and the global comparison circuit is of a precharge/discharge type and receives a logical NAND of outputs from said plurality of bit signal comparison circuits.

5. The decoded signal comparison circuit according to claim 1, wherein each of said plurality of wired OR circuits has a precharging PMOS transistor connected between a predetermined potential node and a wired OR connection node.

6. The decoded signal comparison circuit according to claim 1, wherein each of said plurality of wired OR circuits has one of a discharging NMOS transistor and a precharging PMOS transistor connected between a predetermined potential node and a wired OR connection node.

7. A decoded signal comparison circuit comprising:

a first decoder group including a plurality of first decoders, each receiving address signals in units of at least two bit signals and decoding the address signals;

a second decoder group including a plurality of second decoders, each receiving address signals having a same number of bits as that of the address signals supplied to said plurality of first decoders of the first decoder group and decoding the address signals;

a plurality of bit signal comparison circuits, provided for a plurality of pairs of first and second decoders of the first and second decoder groups, each of said plurality of bit signal comparison circuits receiving a 1-bit signal output from the first decoder and a 1-bit signal output from the second decoder and comparing the two 1-bit signals every time they are input, and each of said plurality of bit signal comparison circuits being activated by one of the two 1-bit signals, which is output from one of a pair of first and second decoders;

a plurality of wired OR circuits respectively provided for said plurality of pairs of first and second decoders, for obtaining a logical OR of signals output from said plurality of bit signal comparison circuits; and a global comparison circuit for detecting coincidence/non-coincidence of signals output from said plurality of wired OR circuits.

8. A decoded signal comparison circuit comprising:

a plurality of bit signal comparison circuits each activated by one of two bit inputs constituting a digital decoded signal which is input to each of the bit signal comparison circuits comparing the two bit inputs with each other; and a plurality of wired OR circuits commonly connecting signals output from said plurality of bit signal comparison circuits and obtaining a logical OR of the output signals.

9. A decoded signal comparison circuit comprising:

a first decoder for receiving address signals in units of at least 2-bit signals, decoding the address signals and outputting a plurality of decoded bit signals;

a second decoder for receiving address signals having a same number of bits as that of the address signals supplied to said first decoder, decoding the address signals and outputting a plurality of decoded bit signals; and a plurality of bit signal comparison circuits, provided for a plurality of pairs of first and second decoders, each of said plurality of bit signal comparison circuits receiving a 1-bit signal output from the first decoder and a 1-bit signal output from the second decoder and comparing the two 1-bit signals every time they are input, and each of said plurality of bit signal comparison circuits being activated by one of the two 1-bit signals, which is output from one of a pair of first and second decoders.

* * * * *